US008265722B2

(12) United States Patent
Park et al.

(10) Patent No.: US 8,265,722 B2
(45) Date of Patent: Sep. 11, 2012

(54) SUPERCONDUCTING WIRE AND MANUFACTURING METHOD THEREOF

(75) Inventors: Pyeong-Yeol Park, Daejeon (KR); Kyeong-Ho Jang, Daejeon (KR)

(73) Assignee: K.A.T. Co., Ltd., Daejeon (KR)

( * ) Notice: Subject to any disclaimer, the term of this patent is extended or adjusted under 35 U.S.C. 154(b) by 531 days.

(21) Appl. No.: 12/517,834

(22) PCT Filed: Dec. 4, 2007

(86) PCT No.: PCT/KR2007/006251
§ 371 (c)(1),
(2), (4) Date: Jun. 5, 2009

(87) PCT Pub. No.: WO2008/072852
PCT Pub. Date: Jun. 19, 2008

(65) Prior Publication Data
US 2010/0317530 A1    Dec. 16, 2010

(30) Foreign Application Priority Data

Dec. 12, 2006  (KR) .................. 10-2006-0126657
Apr. 10, 2007  (KR) .................. 10-2007-0035297

(51) Int. Cl.
*H01B 12/00* (2006.01)
*H01B 13/00* (2006.01)
*H01L 39/24* (2006.01)

(52) U.S. Cl. ........ 505/231; 505/230; 505/431; 505/433; 505/704; 174/125.1; 29/599

(58) Field of Classification Search .......... 505/230–231, 505/430–431, 433, 815, 919, 920, 930; 428/614, 428/660, 662, 674, 930; 174/125.1; 29/599; 148/96, 98; 420/425, 901
See application file for complete search history.

(56) References Cited

U.S. PATENT DOCUMENTS 3,930,903 A    1/1976 Randall et al.
5,127,149 A *  7/1992 Ozeryansky .................. 29/599

FOREIGN PATENT DOCUMENTS

| JP | 04-129106 | 4/1992 |
| JP | 2004-000931 | 1/2004 |
| JP | 2008-300337 | * 12/2008 |
| JP | 2009-167531 | 7/2009 |
| KR | 10-0726186 | 6/2007 |
| KR | 102005119080 | * 6/2007 |

OTHER PUBLICATIONS

International Search Report and Written Opinion of the International Searching Authority, International Patent Application No. PCT/KR2007/006251, mailed Mar. 7, 2008.

* cited by examiner

*Primary Examiner* — Stanley Silverman
*Assistant Examiner* — Kallambella Vijayakumar
(74) *Attorney, Agent, or Firm* — Michael Best & Friedrich LLP

(57) ABSTRACT

Disclosed is a superconducting wire and a method for manufacturing the same, in which spacer are inserted into each space formed between modules, the spacers being different kinds according to a shape of each space when a restacking billet is manufactured in an internal diffusion method for manufacturing a Nb3Sn superconducting wire. One of a copper spacer and a low tin/copper spacer having a sectional area rate of copper/tin more than 6.0 is arranged between three modules as well as between two modules and a diffusion preventing tube, and a high tin/copper spacer having a sectional area rate of copper/tin less than 0.01~1.5 or a middle tin/copper spacer having a sectional area rate of copper/tin less than 1.5~6.0 is arranged between four modules.

6 Claims, 7 Drawing Sheets

[Fig. 1]
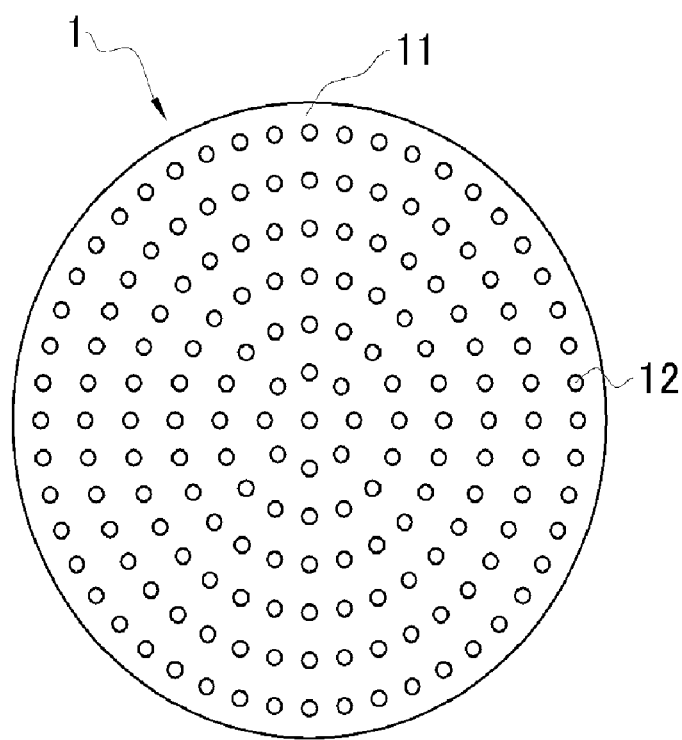
[Fig. 2]
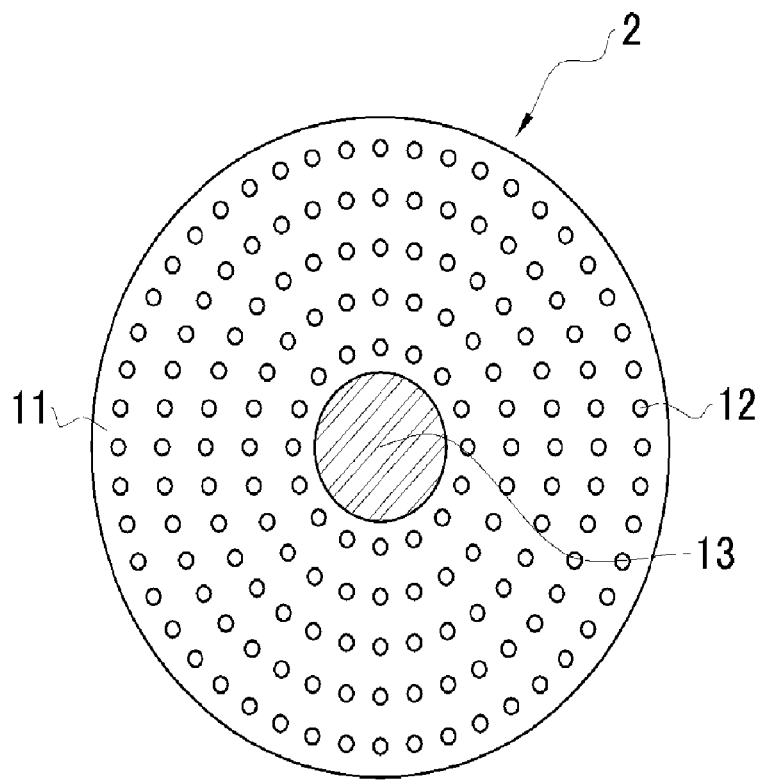

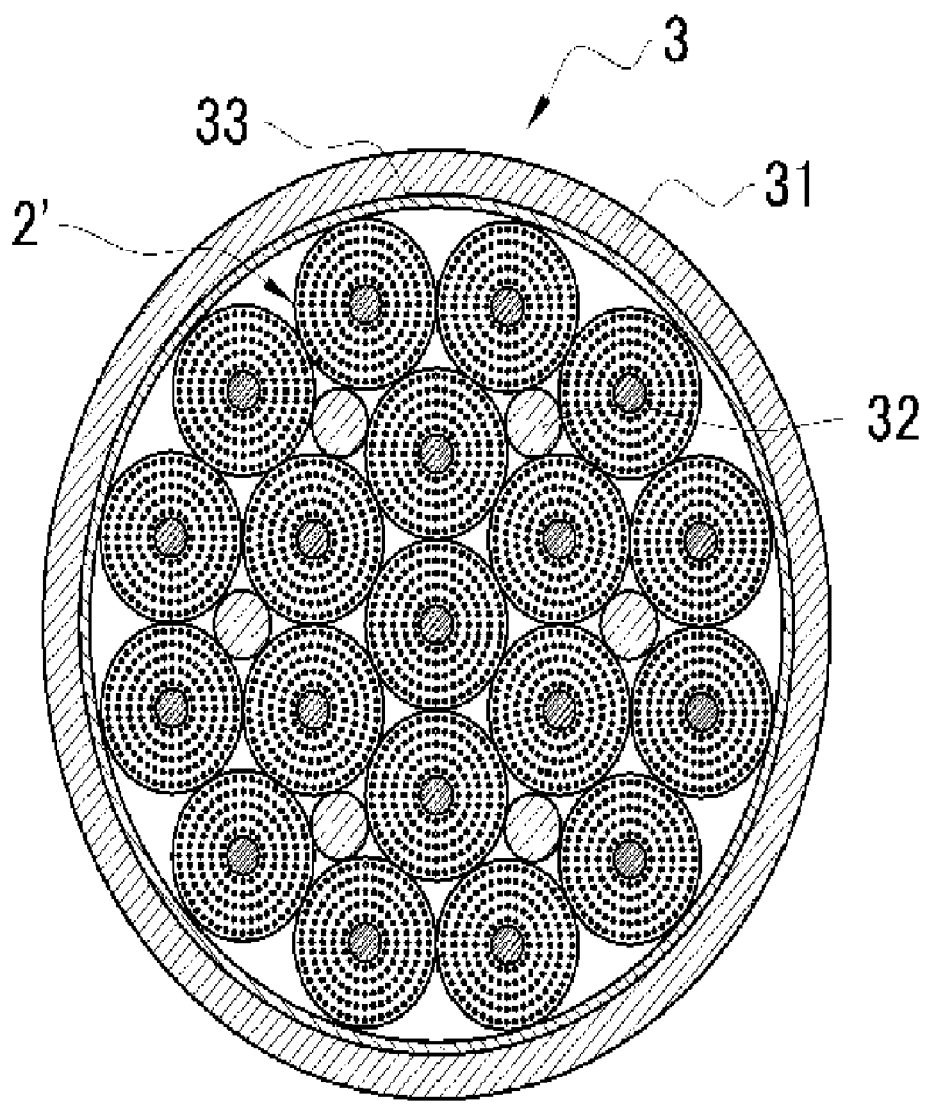
[Fig. 3]

[Fig. 4]
4A
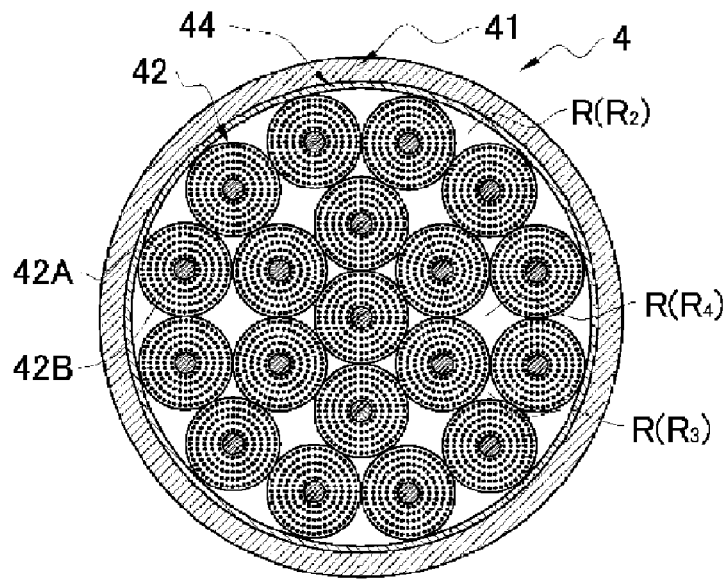
4B
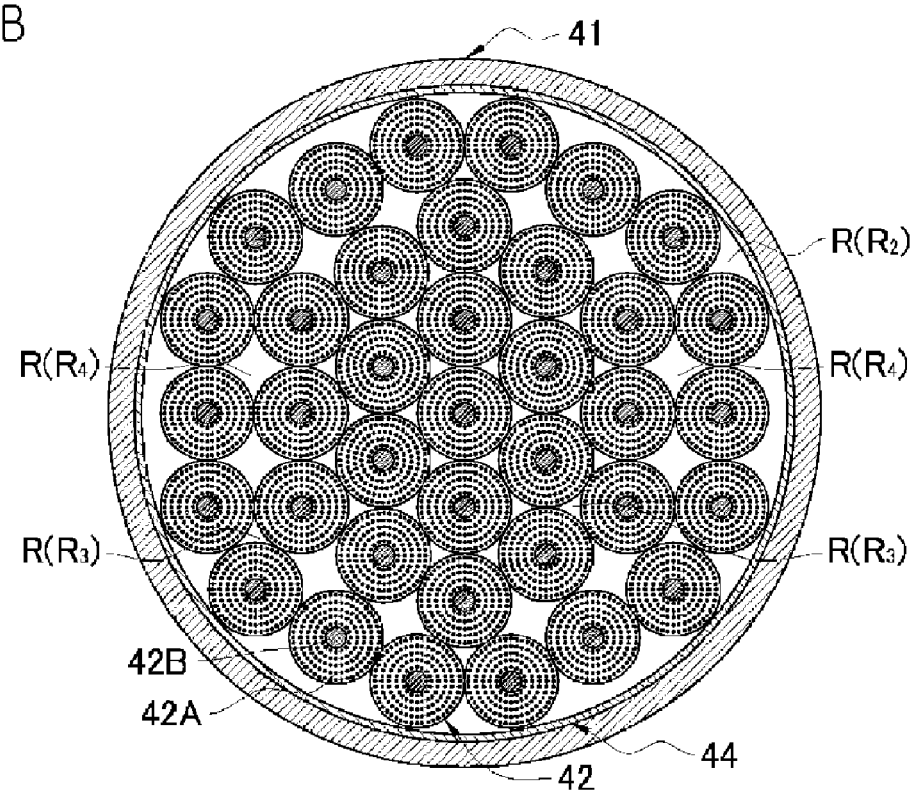

[Fig. 5]
5A
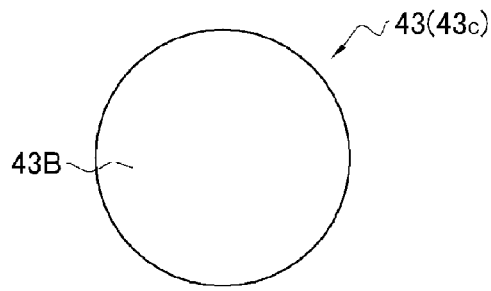
5B
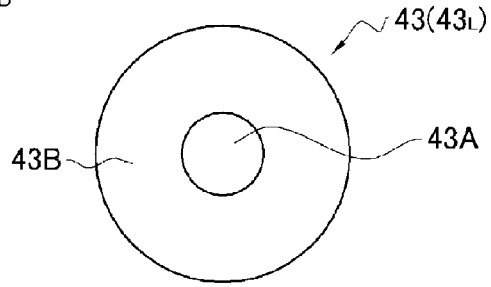
5C
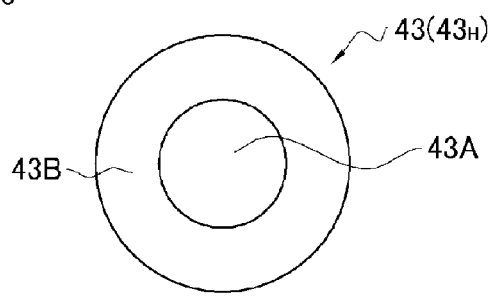
[Fig. 6]
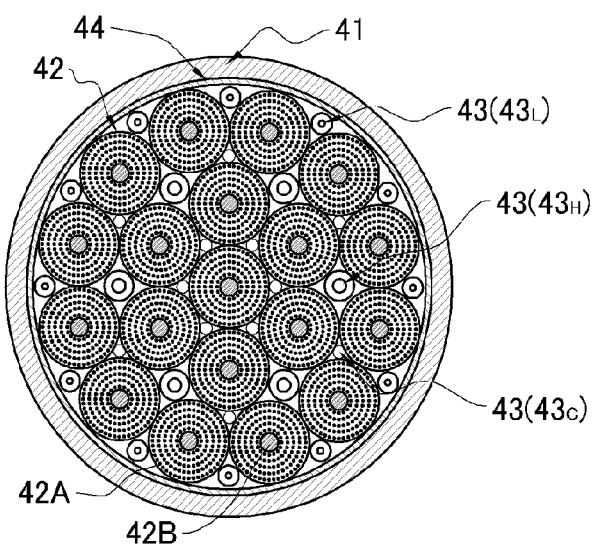

[Fig. 7]
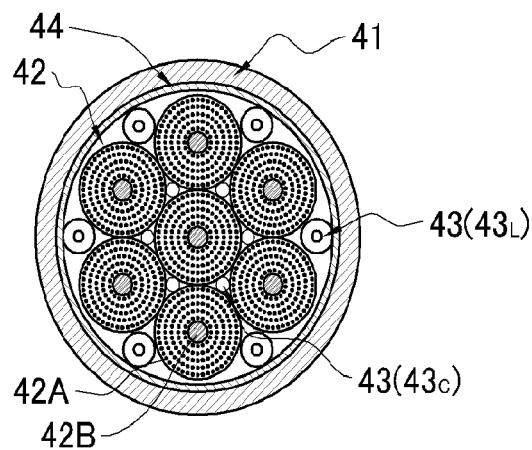
[Fig. 8]
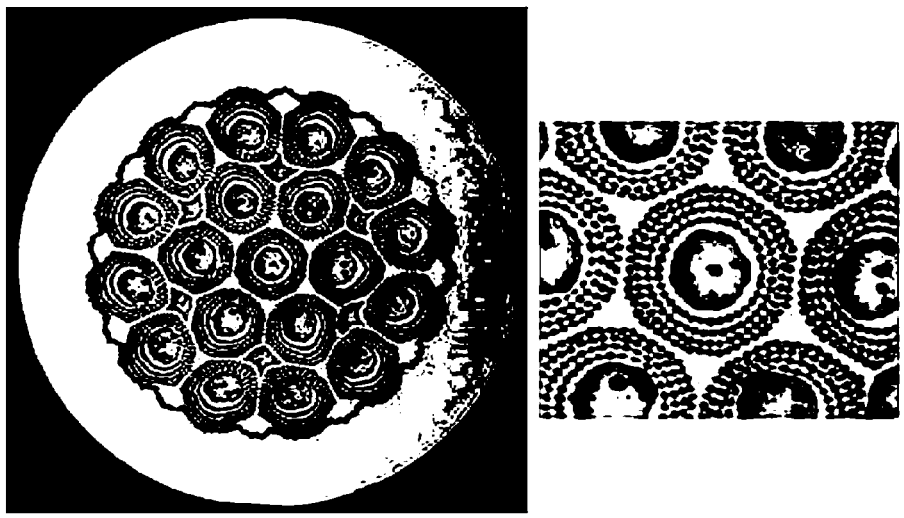
[Fig. 9]
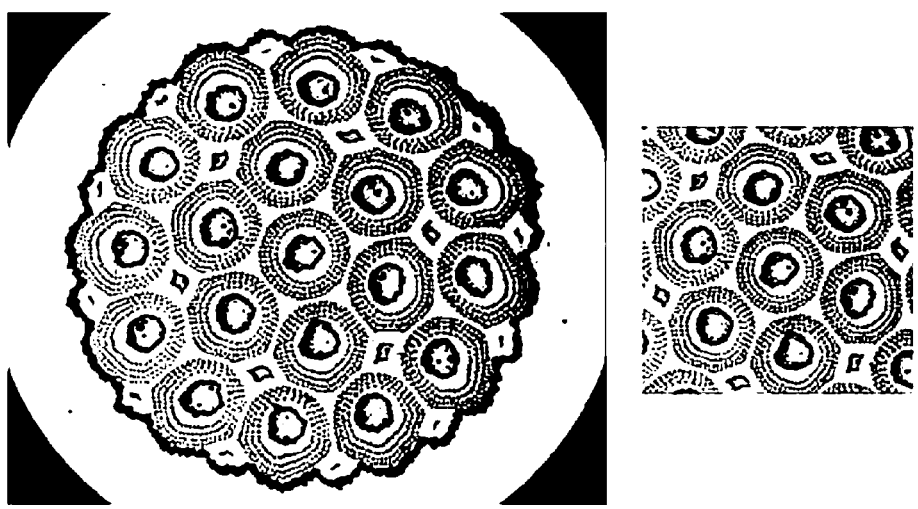

[Fig. 10]
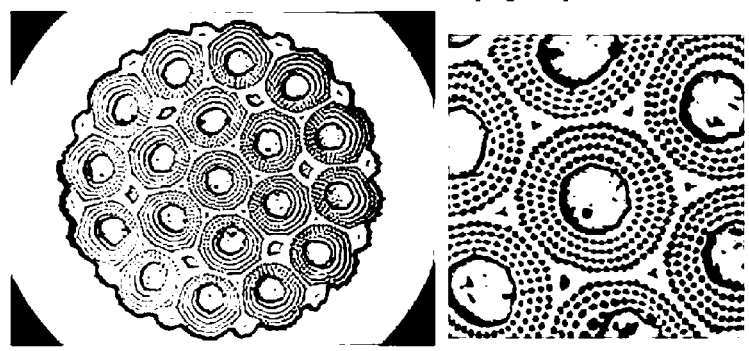
[Fig. 11]
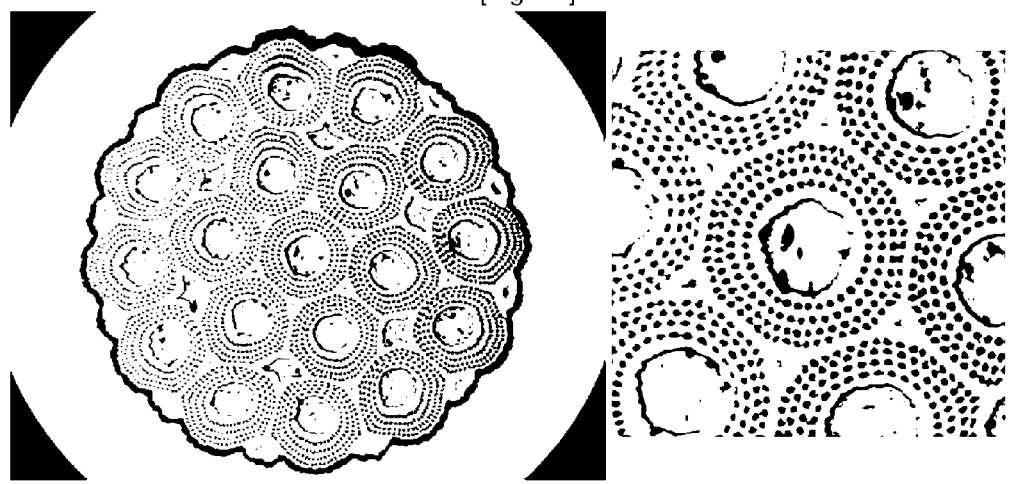
[Fig. 12]
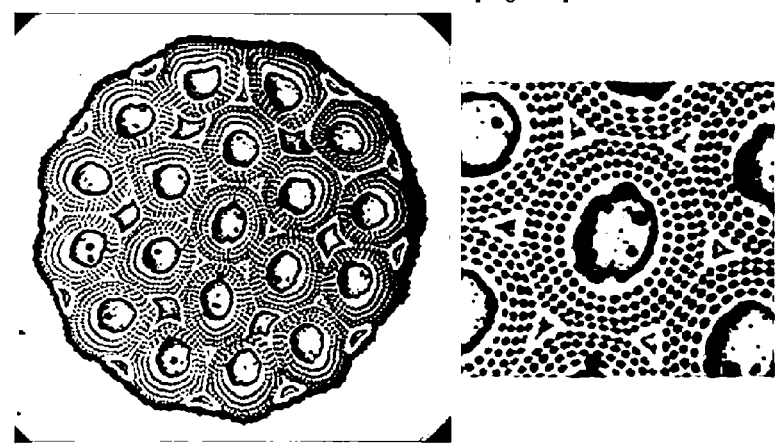

[Fig. 13]
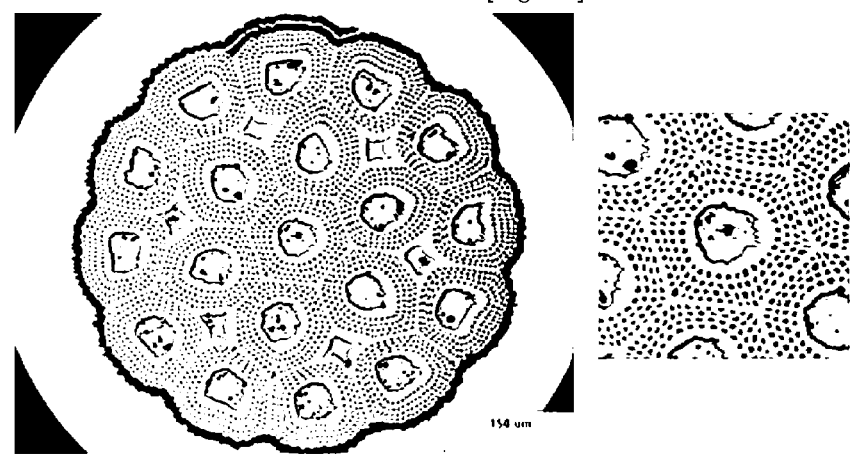
[Fig. 14]
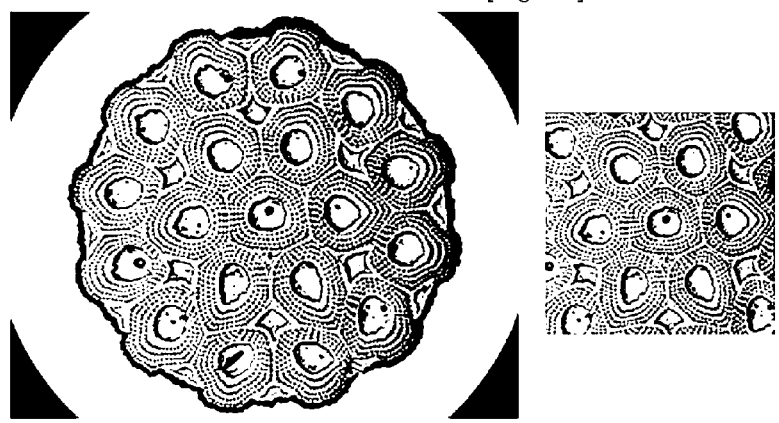

SUPERCONDUCTING WIRE AND MANUFACTURING METHOD THEREOF

TECHNICAL FIELD

The present invention relates to a superconducting wire having different kinds of spacers which are arranged between a diffusion preventing tube and modules as well as between modules in an internal diffusion method in which a tin rod is inserted into a space formed by boring a hole having a predetermined size through a central part of a copper rod manufactured as an extrusion billet, a plurality of modules, which formed by cutting and cleaning a subelement having niobium filaments inserted into and arranged at a copper matrix of a periphery of the tin rod, collectively arranged within the diffusion preventing tube so as to form a restacking billet, and then the restacking billet undergoes a drawing process and a heat treatment several tens of times, thereby manufacturing a Nb3Sn superconductor wire of an A15 structure.

BACKGROUND ART

Superconductivity is a phenomenon where electrical resistance of outer applied voltage with respect to current drops to zero under a certain temperature and a certain magnetic field so that electrons in a copper pair are formed according to BCS theory, and as a result, loss of heat caused by the resistance disappears. With many kinds of metals, electrical resistance suddenly drops to zero under a low temperature of about −270~−196° C. At this time, this kind of material refers to a superconductor, and a temperature and a magnetic field which allow superconductivity to occur refer to a 'critical temperature' and a 'critical magnetic field,' respectively.

In general, all materials include spin magnets which are entirely attracted by a magnet while being arranged in a direction of an external magnetic field. Typical material, which has much less effect that such spin magnets are arranged in a magnetic field direction so that a phenomenon of the material being attracted by a magnet is rarely observed in a normal state, refers to a paramagnetic material, and material in which such a characteristic is superior so that the material is easily attracted by a magnet, i.e. material such as iron, refers to a ferromagnetic material.

Also, a material, whose internal electrons allows induced current caused by electromagnetic induction to flow under influence of an external magnetic field due to absence of spin magnets so as to intercept an external magnetic field so that the material is forced in such a direction that it is repelled from a magnet, refers to diamagnetic material.

In a case where such a superconductor is used as a coil, since loss of energy doesn't occur, an electromagnet, which can make a strong magnetic field under a small amount of current, can be made, and since a superconductor is a diamagnetic substance, if a magnet is located on the superconductor, a magnetic field caused by the magnet cannot pass through the superconductor, but is repelled from the superconductor so that the magnet can be levitated.

The main characteristic of a superconductor, which allows such superconductivity to occur, is that it is nonresistance-substance that does not have resistance disturbing current flow under a certain temperature and a certain magnetic field, but it is a diamagnetic substance which does not allow a magnetic field to pass through, and it can accept an external magnetic field so as to be in a state where a superconducting state is mixed with a normal state.

A superconductor is divided into a type I superconductor, which has an electric resistance of zero and also has a strong diamagnetic characteristic so as to completely cancel an external magnetic field so that an internal magnetic field of the superconductor drops to zero, and a type II superconductor, which accepts an external magnetic field based on a certain limited value, so that a superconducting state is broken and mixed with a normal state.

The type I superconductor includes most pure metals and its characteristic appears when an outer magnetic field (H) is smaller than a critical magnetic field (Hc). The type I superconductor allows super current to flow along a surface of the superconductor but doesn't allow current to flow into the interior of the superconductor at a depth deeper than a predetermined depth, so that an inner magnetic field disappears. The type I superconductor exhibits a meissner effect of superconductive current flow so that an inner magnetic field flows in an opposite direction of an external magnetic field so as to cancel the external magnetic field.

The type II superconductor includes Nb3Sn, Nb3Al, NbTi, MgB2, a high temperature superconductor, etc., and shows a strong magnetic field. The type II superconductor impels an outer magnetic field to a lower critical magnetic field Hc1 so that a diamagnetic state where a magnetic field doesn't exist at the interior of a superconductor is achieved, but accepts an outer magnetic field (H) little by little between a lower critical magnetic field (Hc1) and an upper critical magnetic field (Hc2) so that the superconductor starts breaking bit by bit and generating countless vortexes in a normal state.

Also, in the type II superconductor, a state where a superconductive property and a vortex are mixed with each other is formed so that two electrons in a copper pair are formed. Therefore, there are a superconductor allowing superconductive current to flow along a peripheral surface of the vortex and another superconductor allowing superconductive current to flow without electric resistance while forming two electrons in a copper pair by current applied from an external.

Particularly, the type II superconductor has a superior superconductive characteristic since it has a big flux pinning (vortex pinning) effect where a vortex is prevented from moving, but when its magnetic field is over an upper critical magnetic field (Hc2), the type II superconductor returns to a normal state while superconductivity is broken.

Also, a superconductor can be divided into a high temperature superconductor and a low temperature superconductor according to a temperature at which it is used. The former allows superconductivity at a temperature of liquid nitrogen (77K), and the latter allows superconductivity at a temperature of liquid helium (4K). More than one thousand kinds of such superconductors are discovered from a metal, organic matter, ceramic, chemical compound, etc. Nb—Ti alloy which is a metal-based superconductive material, and Nb3Sn, which is chemical compound-based superconductive material, have recently been put to practical use, and they are used in a tokamak device for a fusion reactor, a particle accelerator, a medical MRI, an analytic NMR, etc.

So as to make a magnet which can create a very large magnetic field by using superconductors which are used in various fields as described above, a superconducting wire, which has a superior critical current (IC) as well as a strong characteristic such as critical current density (JC) in a ferromagnetic field, is required. A typical superconducting wire can be a metallic compound Nb3Sn wire which has been manufactured by various methods, such as an internal diffusion method, a bronze method, etc.

According to the internal diffusion method, as shown in FIGS. 1 to 3, niobium filaments 12 are inserted into and are properly arranged at a proper interior position of one 11 of a copper rod and a copper alloy rod having copper as a matrix in an axial direction so as to form an extrusion billet 1, and then the extrusion billet 1 is extruded so as to form an extrusion rod.

Then, a hole is bored through a central part of the extrusion rod, one 13 of a tin rod and a tin alloy rod is inserted into the hole, and then a drawing process is repeatedly performed several times so as to manufacture a subelement 2. A plurality of modules 2 made by cutting the subelement 2 into a proper length and cleaning it are collectively arranged at the interior of a diffusion preventing tube 33 made from tantalum or niobium, etc., and then a spacer 32 is inserted into each space between the modules 2. Therefore, a restacking billet 3 is formed according to such a scheme.

At this time, the diffusion prevention tube 33 is assembled with an inner circumferential surface of the stabilizing tube 31 made from copper or copper alloy while making contact therewith.

The restacking billet made as described above undergoes heat-treatment after a drawing process performed several tens of times so that reciprocal diffusion reaction occurs between any one of a copper rod and a copper alloy rod and niobium filaments due to the heat treatment, thereby forming an Nb3Sn chemical compound, which is a superconductor.

At this time, the spacers 32 inserted into the interior of the restacking billet 3 are used to minimize space necessarily formed between the modules 2. In the conventional art, a tin-based spacer such as a tin rod, a tin alloy rod, etc. is used, and it is typical that a plurality of modules 2 having a circle-sectional shape is inserted into the diffusion prevention tube 33, and then the spacer 32 is inserted into only the largest space among spaces formed between the modules 2.

Therefore, when the restacking billet having spacers inserted therein undergoes a drawing process several tens of times, each space between the modules disappears while being compressed so that a sectional shape of each subelement is changed from a circular shape to a hexagonal shape. Through such a series of drawing processes, inner stress of each subelement becomes irregular, and as a result, wire cutting occurs during a drawing process so that a problem is generated in manufacturing a wire having a long length, and manufacturing costs also increase.

As an example of the above described method, a method for manufacturing an A15 type Nb3Sn superconducting wire by using an internal diffusion method is disclosed in Japan Patent NO. 4-129106. In this method, six tin alloy spacers are inserted into the outermost layer at which seven modules are stacked, and a tin alloy spacer having a small wire diameter is inserted into each space having a section of a roughly triangular shape, which is formed between three modules. While a corner part is formed at an outer periphery of each module, each niobium filament is changed into a flat shape, and not into a circular shape. In a magnet integrally formed through a stranded cable process for twisting several superconducting wires into several ones, a cabling, a welding process, etc., deformation-resistance against a repetition cycle in compression and extension generated under a specific environment causing superconductivity, particularly under an extremely low temperature and a high magnetic field, becomes weaker. Therefore, deterioration of a superconductive characteristic, such as reduction of a critical current of a superconducting wire, n-value, etc., is caused.

Also, when each shape of the niobium filaments is irregularly changed into a flat shape, and not into a circular shape, a critical current density is remarkably reduced due to an outer magnetic field, and magnetization loss respective to an applied magnetic field is generated. Therefore, there is a limitation in the application of a superconducting wire generating a strong alternating current magnetic field, and a superconductive characteristic respective to strain caused by a repetition cycle in extension and compression under an extremely low temperature is remarkably deteriorated.

Also, due to an excessive amount of a tin element, as a superconductive material generated through undergoing a drawing and a heating process, unusual superconductive material such as Nb6Sn5 or NbSn2, etc. and not Nb3Sn, is generated so that a critical current is too lowered.

DISCLOSURE OF INVENTION

Technical Problem

The present invention has been made so as to resolve problems caused by a conventional restacking billet manufacturing process for collectively arranging a plurality of modules together with tin spacers within a diffusion preventing tube when manufacturing an Nb3Sn superconducting wire according to an internal diffusion method. The present invention provides a superconducting wire, in which a method for arranging a copper or copper alloy spacer including copper or copper alloy and a Sn alloy spacer including copper or copper alloy and tin or tin alloy composed therein with a predetermined rate and their kinds are differently determined so that the change of a sectional shape of a module from an original circular shape into a hexagonal shape is minimized in a high strength drawing process performed several tens of times, and a module and a shape-change thereof can be adjusted with balance so as to keep a near circular shape of a filament.

Also, the present invention provides a superconducting wire which can form a uniform superconductive material in such a manner that a circular shape of each niobium filament is kept as circular as possible, so that accordingly, generation of wire cutting is suppressed during a drawing process, tins are arranged with balance so that diffusion pressure according to movement of tin atom is controlled during a heat treatment process of a superconducting wire, and also so that generation of unusual superconductive material due to an excessive amount of tin can be prevented.

Technical Solution

The above described object of the present invention is achieved by a plurality of different kinds of spacers with a relative sectional area rate respective to a different element.

Before description, so as to avoid confusion between terms, terms of elements constituted in the present invention are the same described above. A copper alloy rod, which has a copper rod or copper as matrix and niobium filaments inserted into and arranged at a proper interior position thereof in an axial direction, refers to a "extrusion billet", and the extrusion billet, which has undergone through a drawing process in a state where a tin rod or a tin alloy rod was inserted into a hole bored through a central part of the extrusion billet after the extrusion billet has been extruded, refers to a "subelement."

Also, an abject made by cutting the subelement into a proper length and cleaning it refers to a "module," and an object, which is formed in such a manner where a plurality of modules is collectively arranged within the diffusion preventing tube made from tantalum, niobium, etc., a rod-shaped spacer is inserted into each space of an inner circumferential surface of the diffusion preventing tube, and then an inner circumferential surface of a stabilizing tube made from copper, copper alloy, etc. makes close contact with an outer circumferential surface of the diffusion preventing tube, refers to a "restacking billet."

There is a technical characteristic of the present invention in that different kinds of spacers are used according to a space-shape of an inner periphery of the diffusion preventing tube so as to manufacture a superconducting wire according to the present invention, particularly, a Nb3Sn superconducting wire by using an internal diffusion method.

Also, the spacer has a circular rod-shape and is one of a tin/copper spacer and a copper spacer, in which a tin or tin alloy (hereinafter, refers to only "tin" for convenience) rod is inserted into a central part of a copper or copper alloy (hereinafter, refers to only "copper" for convenience) rod while making close contact therewith.

At this time, the tin/copper spacer is one among a spacer having a tin rod inserted into a central part of a copper rod, a spacer having a tin alloy rod inserted into a central part of a copper rod, a spacer having a tin rod inserted into a central part of a copper alloy rod, and a spacer having a tin alloy rod inserted into a central part of a copper alloy rod, and the copper spacer is one of only a spacer made of a copper rod and a spacer made of a copper alloy rod.

Also, there is another technical characteristic of the present invention in that, in a case of the tin/copper spacer, spacers having each different sectional area rate of a copper rod respective to a tin rod, based on a sectional surface perpendicular to an axial direction, are used.

Particularly, in the superconducting wire according to the present invention, after a module is positioned at a central part of the diffusion preventing tube, a plurality of modules are sequentially stacked on the periphery of the module while making a shape of a multi-layers, a high tin/copper spacer having a sectional area rate of copper respective to tin, which is comparatively small rate, is inserted into an inner space formed between four modules among spaces formed between modules, and a low tin/copper spacer or a copper spacer having sectional area rate of copper respective to tin, which is a comparatively big rate, is inserted into an inner space formed between three modules and an inner space formed between the diffusion preventing tube and two modules.

At this time, "high tin" and "low tin" of the high tin/copper or a low tin/copper spacer are comparatively divided according to a difference between sectional area rates of copper of the spacers, and the "high tin" can be again divided into a "high tin" and a "middle tin."

The reason why different kinds of spacers are used according to a space-shape will be described below.

In a case where modules, which are made by cutting and cleaning a subelement having a structure where niobium filaments having a very small diameter are inserted into and arranged at copper matrix surrounding the tin rod, are inserted into and arranged within the diffusion preventing module, copper matrixes of modules are combined at spaces between the modules, as well as between the modules and the diffusion preventing tube.

Therefore, spacers of different shapes are used according to the shape of a space within the diffusion preventing tube so as to lead balanced deformation between modules or between a spacer and a module in a drawing process, prevent a superconductive characteristic from being deteriorated as niobium filaments move while diffusion pressure according to movement of tin atoms is operated in tin diffusion respective to niobium filaments during a heat treatment, and cause diffusion reaction of filaments, copper, and tin, which are positioned at each place, so as to form superconductive material having uniform composition.

Particularly, as a spacer inserted between three modules as well as between the diffusion preventing tube and two modules, a low tin/copper spacer whose a sectional area rate of a copper rod respective to a tin rod is more than 6.0, or a copper spacer whose sectional area rate of a copper rod respective to a tin rod is infinity ($\infty$) is used, and as a spacer inserted between four modules, a high tin/copper spacer whose a sectional area rate of a copper rod respective to a tin rod is within the range of 0.01~6.0 is used.

At this time, the high tin/copper spacers can be again divided into one having a sectional area rate less than 0.01~1.5 as a high tin/copper spacer and one having a sectional area rate less than 1.5~6.0 as a low tin/copper spacer.

Strength of each spacer as described above decreases according to the order of a copper spacer, a low tin/copper spacer, and a high tin/copper spacer, as a sectional area rate of copper is reduced. The copper spacer and the low tin/copper spacer make a corner part of a module rounder while preventing a sectional shape of a module from becoming a hexagonal shape, thereby improving a superconductive characteristic such as a critical current, etc. of the final superconducting wire.

Also, the reason why spacers having different strengths are used is that the spacer shows forming type different from each other according to an inner space into which a spacer is inserted during a drawing process. A copper spacer, a low tin/copper spacer, and a high tin/copper spacer are used, but in a case of a tin/copper spacer, if a sectional area rate of copper respective to tin in a direction perpendicularly to an axial direction does not reach or exceeds a limited rate range, a sectional shape thereof after undergoing a drawing process is not a preferable shape, so that a superconductive characteristic is degraded.

At this time, in a tin/copper spacer, the reason why a sectional area rate of copper respective to tin is limited as described above is described below. In a case of a high tin/copper spacer, if the rate is more than 6.0, strength of the spacer unnecessarily increases so that a shape of each module is easily changed into a non-circular shape during a drawing process. Accordingly, filaments within the modules are easily changed into an ununiform shape or a flat shape, and not a circular shape, and the interval between filaments also becomes irregular so that diffusion of a Sn atom is ununiform during a heat treatment for forming a Nb3Sn superconductive wire of a A15 structure. Therefore, a superconducting characteristic can be degraded.

Also, if the sectional area rate is less than 0.01, the strength of a spacer is insufficient so that stress is concentrated toward a spacer having a less strength. Therefore, a shape of a module can be also easily changed into a circular shape or an elliptic shape.

Also, in a case of a low tin/copper spacer, the same as a case of a high tin/copper spacer, if the sectional area rate is less than 6.0, the strength of a spacer is insufficient so that deterioration of superconductive characteristic, such as ununiform deformation of modules, is caused during a drawing process.

Advantageous Effects

In the superconducting wire according to the present invention, spacers are inserted into each inner space between the modules inserted into an inner circumferential part of a diffusion preventing tube, and, many kinds of tin/copper spacers having a cross sectional area rate of copper respective to tin, which are different from each other according to the shape of an inner space, are used. Therefore, wire cutting is reduced in comparison with comparative material in the drawing so that productivity, as well as conformity of inner organization, is improved, and superconductivity is also remarkably improved.

BRIEF DESCRIPTION OF THE DRAWINGS

The foregoing and other objects, features and advantages of the present invention will become more apparent from the following detailed description when taken in conjunction with the accompanying drawings in which:

FIG. 1 is a sectional view illustrating an extrusion billet into which niobium filaments are inserted;

FIG. 2 is a sectional view illustrating a subelement in which a tin rod is coupled with a central part of an extrusion rod;

FIG. 3 is a sectional view illustrating a conventional restacking billet in which a plurality of modules is assembled with a diffusion preventing tube;

FIGS. 4A and 4B are views illustrating a restacking billet for manufacturing a superconducting wire according to an embodiment of the present invention, in which the restacking billet is in a state before spacers are assembled;

FIG. 4A is a sectional view illustrating a restacking billet in which 19 modules are inserted and arranged therein;

FIG. 4B is a sectional view illustrating an restacking billet in which 37 modules are inserted and arranged therein;

FIGS. 5A to 5C are views illustrating a spacer used for a restacking billet as shown in FIG. 4A to 4B;

FIG. 5A is a sectional view illustrating a copper spacer;

FIG. 5B is a sectional view illustrating a low tin/copper spacer;

FIG. 5C is a sectional view illustrating a high tin/copper spacer;

FIG. 6 is a sectional view illustrating a restacking billet for manufacturing a superconducting wire according to an embodiment of the present invention, in which spacers are assembled;

FIG. 7 is a sectional view illustrating a restacking billet for manufacturing a superconducting wire according to another embodiment of the present invention, in which spacers are assembled;

FIG. 8 is a sectional photo illustrating the inventive material 1 according to the present invention, in which the inventive material 1 is in a drawn state prior to heat treatment;

FIG. 9 is a sectional photo illustrating the inventive material 2 according to the present invention, in which the inventive material 2 is in a drawn state prior to heat treatment;

FIG. 10 is a sectional photo illustrating the inventive material 3 according to the present invention, in which the inventive material 3 is in a drawn state prior to heat treatment;

FIG. 11 is a sectional photo illustrating the inventive material 4 according to the present invention, in which the inventive material 4 is in a drawn state prior to heat treatment;

FIG. 12 is a sectional photo illustrating comparative material 1 according to the present invention, in which the comparative material 1 is in a drawn state prior to heat treatment;

FIG. 13 is a sectional photo illustrating comparative material 2 according to the present invention, in which the comparative material 2 is in a drawn state prior to heat treatment; and FIG. 14 is a sectional photo illustrating comparative material 3 according to the present invention, in which the comparative material 3 is in a drawn state prior to heat treatment.

MODE FOR THE INVENTION

With reference to FIGS. 4A to 6, a structure of a restacking billet for manufacturing a superconducting wire according to the present invention, in which different kinds of spacers are used while being mixed, will be described below.

As shown, a restacking billet 4 for manufacturing a superconducting wire according to the present invention has a structure where a plurality of modules, of which the number is 19, 37, 64, etc., is typically inserted into a diffusion preventing tube 44, and spacers 43, the spacers having sectional area rates different from each other, are inserted into each inner space R formed between the modules 42.

At this time, the diffusion preventing tube 44 has an outer circumferential surface assembled with an inner circumferential surface of a stabilizing tube 41 while making contact therewith, and each inner space R formed at an inner periphery of the diffusion preventing tube 44 is divided into a triangular space R3 formed between three modules 42, a square space R4 formed between four modules 42, and an outer space R2 formed between modules two 42.

Also, one of a copper spacer 43C having a comparatively high strength and a low tin/copper spacer 43L is inserted into the triangular space R3 and the outer space R2, and a high tin/copper spacer 43H having a comparatively low strength is inserted into the square space R4.

In this state, it is possible to distinguish the triangular space R3 from the outer space R2 so that a copper spacer can be inserted into the triangular space and a lower tin/copper spacer can be simultaneously into the outer space. On the other hand, a low tin/copper spacer can be inserted into the triangular space and a copper spacer can be inserted into the outer space. Also, a copper spacer and a low tin/copper spacer are inserted into each of the triangular space and the outer space while being mixed with each other, or one of the two above kinds of spacers can be inserted into both the triangular space and the outer space. These types of inserting spacers are properly selected according to a module arrangement shape, degree in a drawing process, a condition of heat treatment, etc. of the superconducting wire to be manufactured.

Also, a sectional area rate, which each original space 43 has before undergoing a drawing process, is nearly the same as the sectional area rate thereof after undergoing the drawing process. Also, respective to an entire sectional area of niobium filaments 42A and copper of a plurality of modules 42 arranged within the diffusion preventing tube 44, the entire sectional area rate of tin rods 42B positioned at central parts of the modules 42 and the tin rods 43B positioned at central parts of the spacers 43 is preferably adjusted within the range of 10~40%.

Particularly, if an entire sectional area of the niobium filaments 42A arranged within the diffusion preventing tube 44 and copper is assumed as "100", an entire sectional area of the tin rods 42B and 43A is preferably assumed as "10~40". At this time, if the sectional area rate is less than 10%, diffusion of tin is not sufficient so that it is difficult to form the chemical compound Nb3Sn, which is a superior superconductive material. On the other hand, if the sectional area rate exceeds 40%, a chemical compound, such as Nb6Sn, NbSn2, etc., which is an unusual superconductive material, is formed due to excessive diffusion of tin atoms so that a superconducting characteristic is deteriorated.

In such a structure, for example, if 19 modules are used, a copper spacer is inserted into the triangular space R3, and a low tin/copper spacer is inserted into the outer space R2, six high tin/copper spacers 43H, twelve copper spacers 43c, and twelve low tin/copper spacers 43L are used. Meanwhile, if 37 modules 42 are used, twelve high tin/copper spacers 43H, 24 copper spacers, and 18 low tin/copper spacers 43L are used.

The restacking billet assembled in such a manner described above undergoes heat treatment after undergoing a drawing process several tens of times, thereby forming a superconductive material Nb3Sn. Copper matrix in an area within the diffusion preventing tube has a diffusion reaction with Sn atoms through the heat treatment so as to be changed into bronze including an amount within 3~15 wt % of Sn, so that a superconductive material Nb3Sn having a superior superconducting characteristic is formed. There are various methods in such a heat treatment for forming such superconductive material. An example of this will be described below.

There is a method for performing heat treatment in such a manner that in a state where an inner atmosphere of a restacking billet is kept in a high vacuum state, a temperature of the inner atmosphere is increased to 200° C. at a speed of 7° C./h, and then the temperature is maintained for five hours. Then, it is increased to 570° C. at a speed of 6° C./h, and this constant temperature is maintained for 200 hours. After completing the constant temperature treatment, the inner atmosphere is increased to 660° C. at a speed of 6° C./h and then the temperature is maintained for 240 hours, and then it is cooled at a speed of 6° C./h.

Also, there is another method for performing heat treatment in such a manner that a temperature of an inner atmosphere of a restacking billet is changed according to five steps, and an increasing temperature speed is 5° C./h in each step. The temperature of 210° C. is maintained for 50 hours, the temperature of 340° C. is maintained for 25 hours, the temperature of 450° C. is maintained for during 25 hours, the temperature of 575° C. is maintained for 100 hours, and the temperature of 660° C. is maintained for 200 hours, thereby forming a superconductive material. Then, the temperature is again cooled to a normal temperature.

At this time, when a temperature increases from 210° C. to 575° C., the temperature can directly increase without several steps, and temperature maintaining time can be changed at a temperature of about 660° C.

Additionally, as shown in FIG. 7, in a case where seven modules are inserted into the diffusion preventing tube 44, only a space for allowing a low tin/copper spacer 43L to be inserted is formed while the above described square space is not formed. In this case, one of a low tin/copper spacer or a copper space is inserted into each inner space, or a low tin/copper spacer as well as a copper spacer is inserted into each inner space while being mixed with each other.

EMBODIMENT

In a state where a extruded copper rod and niobium filaments have been cleaned after holes was bored through the extruded copper rod in an axial direction, seven niobium filaments, 180 niobium filaments, and 176 niobium filaments was inserted into each hole of the copper rod in a conventional manner so as to manufacture an extrusion billet having a diameter of 180 mm, and then this was extruded through heat treatment so that an extrusion rod material having a diameter of 30 mm was manufactured.

After a central part of the extrusion rod material underwent a deep hole process and was cleaned, a tin rod was inserted into the central part of the extrusion rod and was assembled therewith. In this state, the extrusion rod material underwent a drawing process at a rate decreasing more than 20% so that a subelement was manufactured. A module was prepared by cutting the subelement into a proper length and cleaning it, and then, a restacking billet having a diameter of 70 mm has been manufactured by using nineteen modules and spacers.

At this time, the entire number of spaces into which a spacer can be inserted comes to 30, including six square spaces, twelve triangular spaces, and twelve outer spacers.

Also, the inventive material and comparative material, which were manufactured by using spacers of different kinds, were compared with each other, and the results of the comparison are shown in table 1.

TABLE 1

| division | Spacer(sectional area rate of copper respective to tin) | | |
| --- | --- | --- | --- |
| | Square space | Triangular space | Outer space |
| The inventive material 1 | 0.9 | ∞ | ∞ |
| The inventive material 2 | 3.8 | 7.0 | 7.0 |
| The inventive material 3 | 3.0 | ∞ | 8.0 |
| The inventive material 4 | 1.3 | 9.0 | 9.0 |
| Comparative material 1 | 0.9 | 1.4 | 1.4 |
| Comparative material 2 | 0.9 | 0 | 0 |
| Comparative material 3 | 0.9 | 0.9 | 0.9 |

∞: copper spacer
"0": tin spacer

After spacers of different kinds were used, through a drawing process performed several tens of times, superconducting wires having a diameter of 0.816 mm of the inventive material 1, 2, 3, and 4, and comparative material 1, 2, and 3 according to the present invention were obtained. Their sectional photos are shown in FIGS. 8 to 14.

Each sectional shape of modules constituted in a drawn superconducting wire was observed. In a case of comparative material, which uses only a high tin/copper spacer, or uses a high tin/copper spacer and a tin spacer, a high degree in becoming a hexagonal shape can be observed.

However, in a case of the present inventive material which using a high tin/copper spacer and a copper spacer (the inventive material 1), using a middle tin/cooper spacer and a low tin/copper spacer (the inventive material 2), using a middle tin/copper spacer, a copper spacer, and a low tin/copper spacer (the inventive material 3), or using a high tin/copper spacer and a low tin/copper spacer (the inventive material 4), a low tin/copper spacer having a predetermined strength or a copper spacer was inserted into a space of the outermost or the innermost layer. Therefore, it can be understood that polarization between the subelements does not occur so that subelements have a nearly circular and stable shape, and not a hexagonal shape.

Further, after subjecting each superconducting wire to heat treatment, the characteristic of each superconducting wire was examined. As a result of the examination, current when voltage is 0.1 microvolts/cm is determined as a critical current. Moreover, a point with a voltage of 5 microvolts based on an interval of 50 cm between voltage taps is obtained by using the critical current, and a value obtained by dividing the critical current by a sectional area of a non-copper area at the point is determined as a critical current density.

Also, in addition to the critical current and a critical current density, an n-value was used as a value showing a degree of heterogeneousness which a shape of a filament of a superconducting wire had. The N-value as an exponential function, which is used as an indicator showing a degree of ununiformity of a superconducting filament or heterogeneousness of a superconducting wire, particularly, as a standard showing how well a superconducting wire recovers superconductivity when a temperature is again lowered in a case where superconductivity is broken, and as a standard showing how well a superconducting wire is made, was measured so as to be compared.

Additionally, AC loss of a superconducting wire is typically measured by using a calorimetry method, a magnetization method, an electric transfer method, etc. Measuring AC loss of a superconducting wire in the present invention was performed in such a manner that an outer alternating current magnetic filed of a range within +/−tesla is applied to superconductive material of a non-copper part by using a physical property measurement system so as to measure magnetization.

The fact that electric resistance of a superconductor is "0" is observed when current flowing along a superconductor is not changed, and in a case where current is changed, current loss occurs while resistance is generated. Current loss generated at this time refers to AC loss, and AC loss includes coupling loss, eddy current loss, and hysterisis loss.

Also, AC loss is generated due to changes in the magnetic field, and if current is changed, a magnetic field is changed so that AC loss occurs.

Each superconducting characteristic of the present inventive material and a comparative material is shown in FIG. 2.

TABLE 2

| Division | Ic | Jc | n-Value | AC loss |
| --- | --- | --- | --- | --- |
| The inventive material 1 | 250 | 950 | 33 | 712 |
| The inventive material 2 | 270 | 1050 | 40 | 653 |
| The inventive material 3 | 230 | 920 | 32 | 681 |
| The inventive material 4 | 284 | 1090 | 42 | 678 |
| Comparative material 1 | 183 | 637 | 17 | 523 |
| Comparative material 2 | 180 | 630 | 19 | 514 |
| Comparative material 3 | 206 | 770 | 22 | 468 |

Superconducting characteristic is superior as the Jc value and the n-valve are higher, and if Jc value increases, AC loss value increases together with the increase in the Jc value. Therefore, a method for increasing Jc value, while suppressing the increase of the AC loss value at a proper degree, is required.

Also, as comparative material, in a case where a high tin/copper spacer having a sectional area rate of copper, which is near to the lowest limitation value, or a tin spacer is used, although it is possible to decrease diffusion pressure of a tin atom during heat treatment processing so as to allow AC loss to be canceled out at a certain degree, a spacer cannot have sufficient strength during a process for drawing a restacking billet, thereby causing uniformy deformation of modules. Therefore, wire cutting is generated, and a sectional shape of a drawn wire is also distorted so that the shape of a filament is irregularly changed, thereby remarkably degrading a superconducting characteristic.

However, when a restacking billet is manufactured, in a case of the inventive material 1 manufactured so as to solve a problem generated in the comparative material, which was made from a restacking billet manufactured by inserting a high tin/copper spacer into the square space having a sectional area rate of copper which is nearly the lowest limitation value while inserting a copper spacer into the triangular space and the outer space, ununiform deformation of a module positioned at the outermost layer thereof is reduced in a drawing process, and wire cutting also decreases in a wire drawing process so that AC loss increases at a certain degree in comparison with the comparative 1, 2, and 3. However, a critical current, a critical current density, and an n-value remarkably increase, thereby improving superconductivity.

At this time, because a high tin/copper spacer positioned at the square space does not sufficient strength yet, in a case of the inventive material 1, it can be understood that most modules are deviated a little toward an inner direction.

So as to improve the disadvantage of the inventive material 1, the inventive material 2 uses a middle tin/copper spacer, of which a sectional area rate of copper increases in comparison with a high tin/copper spacer so as to control the strength of a high tin/copper spacer for a square space formed between 4 modules. Furthermore, So as to supplement an amount of tin element decreasing accordingly, the inventive material 2 uses a low tin/copper spacer, which is processed in such a manner that a tin or tin alloy rod is inserted into a copper spacer of a triangular shape and an outer space, differently from the inventive material 1.

As a result, polarization toward an inner direction of an outermost layer module, which can be caused in the inventive material 1, disappeared, and spacers including tin or tin alloy (at lest a binary alloy) were symmetrically used at each space within the diffusion preventing tube so that a diffusion reaction of a tin or tin alloy atom was uniformly controlled during heat treatment. Therefore, an Nb3Sn superconductive material of high quality was formed.

Also, while diffusion pressure, which can be generated in diffusion of a tin or tin alloy atom, is cancelled, a bridging phenomenon of a filament can be alleviated. Therefore, a degree in increasing alternating current loss is alleviated, and simultaneously, a superconductive characteristic, such as a critical current or a critical current density, is remarkably improved.

Different from the invention 2, invention 3 uses a copper spacer having a high strength instead of a low tin/copper spacer used in the triangular space so that efficiency in a wire drawing process is improved, and simultaneously, a superconductive characteristic, can be remarkably improved in comparison with comparative material, although diffusion of a tin or tin alloy atom is controlled within the diffusion preventing tube by the copper spacer.

So as to have an improved characteristic more than a characteristic of the inventive material 2, which has the most superior characteristic obtained by inserting a spacer including Sn so as to distribute Sn, the inventive material 4 has a stable section and an optimistic characteristic in such a manner that a high tin/copper spacer having a high level amount of Sn instead of a middle tin/copper spacer of the square space is inserted while all spaces within the diffusion preventing tube are positioned symmetrically to each other and the largest amount of Sn is secured.

Also, disproportion of stress between modules, which is caused during a process for drawing comparative material decreases so that change of a module is uniform. As a result, a superconducting characteristic, such as a Jc value, is improved while an n value increases.

At this time, when a sectional area rate of copper respective to tin of a high tin/copper spacer inserted into the square spacer between the outermost module layer and a module layer adjacent to the interior thereof is more than 6.0, particularly, when a low tin/copper spacer is inserted, the strength of a spacer is too high beyond necessary degree, so that a shape of a module is changed into a certain shape except a circular shape, and tin of a non-copper area too much decreases. Therefore, it is difficult to form an Nb3Sn superconductive material of high quality is formed.

As a result, each filament within a module can be changed into an ununiform shape or a flat sectional shape, but not into a circular shape. Of course, an interval between filaments as well as between filament layers become ununiform so that diffusion of a Sn atom becomes uniform during a heat treatment for allowing an Nb3Sn superconductive material of a A15 structure to react. Therefore, a high quality Nb3Sn superconducting filament of high quality cannot be formed, thereby degrading a superconducting characteristic under an applied magnetic field.

Also, in a filament having a non-circular shape, a superconducting character respective to a strain characteristic can be degraded under a repetition cycle of extension/compression stress at an extremely low temperature at which a superconducting wire is used.

Also, in a case where a sectional area rate of copper respective to tin of a low tin/copper spacer inserted into the triangular space or the outer space is less than 6.0, since strength of each spacer positioned between the outermost module layer and the diffusion preventing tube is lower the same as comparative materials, spacers positioned at the outer space receive high stress during a drawing process so that they are recessed toward a central part of an inner periphery thereof.

Simultaneously, adjacent modules having comparative high strength receives stressed exerted toward an outer side of a wire so that the shape of each module cannot be changed into a circular shape, but is changed into an irregular shape. Therefore, the shape of each filament is easily changed not into a circular shape, but into an irregular shape or a flat shape, and an interval between filaments as well as between filament layers become ununiform. Accordingly, as described above, an Nb3Sn superconducting filament of high quality cannot be formed through a heat treatment so that a superconductive characteristic can be degraded under an applied magnetic field.

Analysis of each sectional area rate of copper and tin constituted in each spacer is performed by an image analyzing device of an optical microscope. A sectional area of the outset thickness of an original module is obtained by dividing a copper area positioned between modules into ½, then, based on this sectional area, an area of a spacer is obtained by excepting the thickness of the outermost layer of the module, which has been divided into ½, from an area of the triangular space or a square space at which spacers are disposed, and each area of tin and copper is analyzed by an image analyzing device of a metal optical microscope from each area of spacers.

The invention claimed is:

1. A superconducting wire comprising:
a diffusion preventing tube having an outer circumferential surface in close contact with an inner circumferential surface of a stabilizing tube;
a plurality of modules collectively arranged within the diffusion preventing tube, the modules having a plurality of niobium filaments arranged at a copper matrix of a periphery of a tin rod positioned at a central part of a copper rod; and
a plurality of spacers inserted into inner spaces of the diffusion preventing tube,
wherein the superconducting wire is manufactured by collectively arranging the modules within the diffusion preventing tube, inserting the spacers into inner spaces of the diffusion preventing tube, and drawing the modules and the spacers, and
wherein one spacer is inserted into each space formed between the diffusion preventing tube and the modules as well as between the modules,
wherein a spacer inserted between the diffusion preventing tube and the modules or between three modules is either a tin/copper spacer having a tin or a tin alloy rod inserted into a central part of a copper or copper alloy rod or is a copper or copper alloy spacer, and
wherein a spacer inserted between four modules is a tin/copper spacer having a tin or tin alloy rod inserted into a central part of a copper or copper alloy rod.

2. A superconducting wire as claimed in claim 1, wherein the tin/copper spacer inserted between the diffusion preventing tube and the modules as well as between the three modules has a sectional area rate of a copper or copper alloy rod respective to a tin or tin alloy rod, which is more than 6.0, based on a sectional surface perpendicular to an axial direction, and a tin/copper spacer inserted between the four modules has a sectional area rate of a copper or copper alloy rod respective to a tin or tin alloy rod, which is less than substantially 0.01-6.0, based on a sectional surface perpendicular to an axial direction.

3. A superconducting wire as claimed in claim 1, wherein a number of the modules is 19, 37, or 64.

4. A superconducting wire as claimed in claim 1, wherein an entire sectional rate of tin rods positioned at central parts of the modules and tin rods positioned at central parts of spacers, respective to an entire sectional area of niobium filaments and copper of the modules positioned within the diffusion preventing tube, is within a range of substantially 10-40%.

5. A method for manufacturing a superconducting wire, comprising the steps of:
extruding an extrusion billet having niobium filaments inserted into an interior of a copper rod in an axial direction so as to manufacture an extrusion rod material;
boring a hole through a central part of the extrusion rod material, inserting one of a tin rod or a tin alloy rod into the hole, and performing a drawing process so as to manufacture a subelement;
collectively arranging a plurality of modules at an interior of the diffusion preventing tube, the modules being formed by cutting the subelement into a proper length and cleaning the subelement; and
manufacturing a restacking billet by inserting a spacer into each inner space within the diffusion preventing tube,
wherein the step of manufacturing the restacking billet comprises the steps of:
dividing inner spaces formed by the diffusion preventing tube and the modules into a triangular space formed between three modules, a square space formed between four modules, and an outer space formed between the diffusion preventing tube and two modules;
inserting either a tin/copper spacer or inserting a copper or copper alloy spacer into the triangular space and the outer space, the tin/copper spacer having a tin or tin alloy rod inserted into a central part of a copper or copper alloy rod; and
inserting a tin/copper spacer into the square space, the tin/copper spacer having a tin or tin alloy rod inserted into a central part of a copper or copper alloy rod.

6. The method for manufacturing a superconducting wire as claimed in claim 5, wherein a sectional area rate of the copper or copper alloy rod respective to the tin or tin alloy rod of the tin/copper spacer inserted into the triangular space and the outer space is higher, based on a sectional surface perpendicularly to an axial direction, than a sectional area rate of the copper or copper alloy rod respective to the tin or tin alloy rod of the tin/copper spacer inserted between the four modules.

* * * * *